U.S. Patent Number: 6,100,743
Date of Patent: Aug. 8, 2000

United States Patent [19]
Gabara

[54] CIRCUIT ARRANGEMENT FOR ADDING FUNCTIONALITY TO A CIRCUIT WITH REDUCED PROPAGATION DELAYS

[75] Inventor: Thaddeus John Gabara, Murray Hill, N.J.

[73] Assignee: Lucent Technologies Inc., Murray Hill, N.J.

[21] Appl. No.: 09/139,300

[22] Filed: Aug. 25, 1998

[51] Int. Cl.[7] .................................................. H03K 17/04
[52] U.S. Cl. ........................ 327/374; 327/199; 327/376; 327/377
[58] Field of Search .................................. 327/374, 375, 327/376, 377, 199, 200, 201, 202, 203

[56] References Cited

U.S. PATENT DOCUMENTS

| | | | |
|---|---|---|---|
| 5,043,605 | 8/1991 | Gabara | 326/73 |
| 5,325,368 | 6/1994 | James et al. | 371/22.3 |
| 5,343,099 | 8/1994 | Shichinohe | 327/108 |
| 5,355,369 | 10/1994 | Greenbergerl et al. | 371/22.3 |
| 5,377,198 | 12/1994 | Simpson et al. | 371/22.3 |
| 5,410,189 | 4/1995 | Nguyen | 327/374 |
| 5,434,804 | 7/1995 | Bock et al. | 364/579 |
| 5,568,492 | 10/1996 | Flint et al. | 371/22.1 |
| 5,598,421 | 1/1997 | Tran et al. | 371/22.3 |
| 5,631,912 | 5/1997 | Mote, Jr. | 371/22.3 |
| 5,648,973 | 7/1997 | Mote, Jr. | 371/22.3 |
| 5,706,297 | 1/1998 | Jeppesen, III et al. | 371/22.3 |
| 5,708,773 | 1/1998 | Jeppesen, III et al. | 395/183.06 |
| 5,768,152 | 6/1998 | Battaline et al. | 364/551.01 |
| 5,831,472 | 11/1998 | Wang et al. | 327/543 |
| 5,920,210 | 7/1999 | Kaplinsky | 327/112 |

*Primary Examiner*—Timothy P. Callahan
*Assistant Examiner*—Hai L. Nguyen
*Attorney, Agent, or Firm*—Darby & Darby

[57] ABSTRACT

An integrated circuit including a primary operating circuit and an added-function circuit which reduces propagation delays during normal operation of the primary operating circuit, the primary operating circuit includes an input and an output, an associated voltage source and ground, a transistor positioned on the path from the voltage source to the output and a second transistor positioned on the path from ground to the output, the added-function circuit includes two transistors, each of which is coupled to a transistor of the primary operating circuit on the path from either the source or ground to the output, and the added-function circuit transistors have widths of at least two times the size of the primary operating circuit transistors such that when the added-function transistors are enabled, a pseudo-voltage source and a pseudo-ground are generated for the primary operating circuit transistors to reduce propagation delays in the primary operating circuit based on the added-function circuit.

21 Claims, 8 Drawing Sheets

CIRCUIT ARRANGEMENT FOR ADDING FUNCTIONALITY TO A CIRCUIT WITH REDUCED PROPAGATION DELAYS

RELATED APPLICATION

This Patent Application is related to patent application, filed Aug. 25, 1998, the same day herewith, entitled "Output Flip-Flop Circuit for Producing an Output Signal and its Complement Simultaneously," of Thaddeus Gabara, which is assigned to Lucent Technology Inc., the Assignee of the present application, and which is incorporated by reference herein.

FIELD OF THE INVENTION

This invention relates to a circuit arrangement for increasing functionality at a circuit node with reduced propagation delays.

BACKGROUND OF THE INVENTION

It is common to add functionality to the node of a circuit module, particularly for testing circuit arrangements. One conventional testing protocol is set forth in the Joint Testing Action Group (JTAG) IEEE 1149.1 standard. IEEE standard 1149.1 (hereinafter "JTAG") was developed as a specification for a standardized serial test bus for testing integrated circuit components or circuit modules and their interconnections on a printed circuit board, as well as for observing or modifying circuit activity during normal operation of the components. The JTAG test access port logic is entirely separate from the core circuit module operation on an integrated circuit device, and is accessed by five unique and dedicated component pins. The JTAG standard defines how the logic must function to be standard compliant. Implementation of a JTAG testing circuit at a node of a circuit module adds functionality to that node.

However, adding functionality to a node of a circuit module, e.g., to implement JTAG, involves the use of additional logic functions, such as, e.g., multiplexers (MUXs), and NAND and NOR gates. The additional logic functions add a load to the circuit which causes propagation delays in the normal or non-JTAG testing mode of the circuit module. The increase in propagation delays slows down the performance of the circuit. Therefore, there is a need to add functionality to a node of a circuit module, such as for implementing JTAG or non-JTAG testing, while reducing propagation delays.

SUMMARY OF THE INVENTION

In accordance with an embodiment of the present invention, two transistors are added to a circuit module to support an added-function circuit. More particularly, the voltage source and ground for supplying a circuit module along an IN to OUT path, are connected to the circuit module by the two transistors, one associated with the voltage source and the other associated with ground. The transistors in the added-function circuit have large widths compared to the circuit components of the circuit module on the path from the voltage source to OUT or from the ground to OUT. More particularly, the added-function circuit transistor associated with the voltage has a large width compared to each of the circuit module transistors on the path from the voltage source to the OUT. Similarly, the added-function transistor associated with the ground has a large width compared to each of the circuit module transistors on the path from ground to OUT. The width of the added-function transistors is in the range of at least two times, and preferably three to five times, the width of transistors within the circuit module. As a result, the transistors associated with the voltage source and ground have a small resistance (since resistance is inversely proportional to the width of a transistor). When the added-function circuit is enabled, these transistors are disabled such that the circuit module is not connected to the voltage source or ground and remains in a tristate output condition. As a result, the added-function circuit can supply a signal to the OUT path from the circuit module. However, during normal operation of the circuit module, the transistors associated with the voltage source and ground are enabled to connect the source and ground to the circuit module. When enabled, their resistance is so low in comparison with the transistors of the circuit module, that they in effect create a pseudo voltage source and ground for the circuit module transistors. As a result, the load on the circuit module due to the added transistors, which support the added-function circuit, is reduced. Accordingly, any propagation delays on the circuit module are also reduced.

In a particular embodiment of the present invention, the added-function circuit includes devices used to implement JTAG testing. When the voltage source and ground transistors are disabled, the JTAG testing circuit is enabled such that the JTAG circuit supplies the signal to the output of the circuit module as a consequence of JTAG testing. When the voltage source and ground transistors are enabled, the circuit module is supplied with the voltage source and ground and, thereby, its output is the result of the normal, i.e. non-JTAG testing, mode of operation of the circuit module. In addition, in other embodiments of the present invention, propagation delays in the circuit module are reduced using the same approach when the added-function circuit is a non-JTAG testing circuit or other type of circuit.

BRIEF DESCRIPTION OF THE DRAWINGS

The foregoing and other features of the present invention will be readily understood from the following detailed description of the preferred embodiment taken in conjunction with the accompanying drawings wherein.

DESCRIPTION OF THE ILLUSTRATIVE EXEMPLARY EMBODIMENTS

Figure 1A:
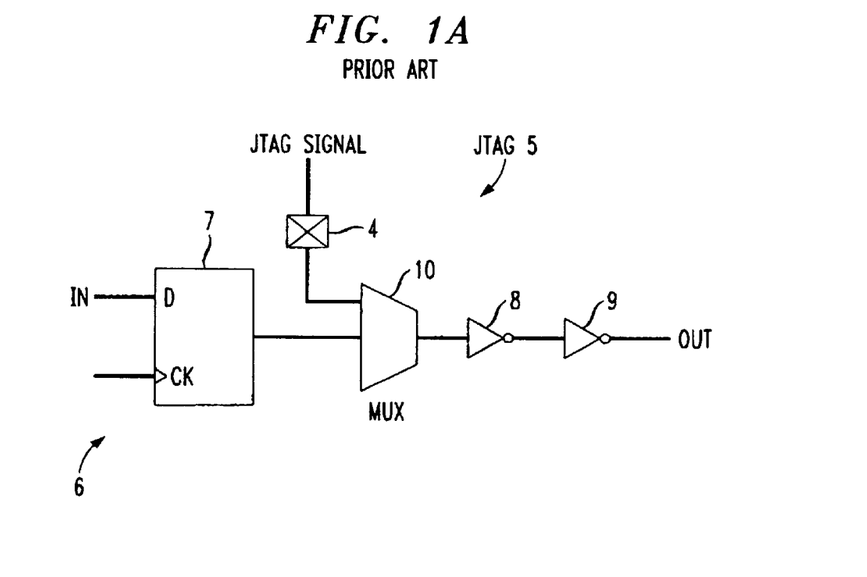
FIG. 1A is a schematic block diagram illustration of a known JTAG testing circuit in a primary operating circuit.

FIG. 1A is a schematic block diagram illustration of a known implementation of a JTAG testing circuit 5. The JTAG testing circuit is implemented in a circuit module 6 (or primary operating circuit) which includes a flip-flop 7 and two inverters 8 and 9. The JTAG testing circuit receives a JTAG signal introduced into a multiplexer 10. In addition, the multiplexer 10 accepts a signal from the output of the flip-flop 7. Flip-flop 7 and inverters 8 and 9 may be part of a larger circuit module. During normal operation, the IN signal is clocked to the output of flip-flop 7. This output is in turn inverted in inverter 8 and inverted again in inverter 9 to produce the OUT signal. However, the input node to inverter 8 has the multiplexer 10 of JTAG 5 connected to it. As a result, instead of the IN signal being clocked to this node, the JTAG test signal may be passed to this node by the multiplexer 10 under the direction of control circuit 4. The JTAG signal from control circuit 4 will test the operation of inverters 8 and 9.

While the inclusion of multiplexer 10 permitted the use of the JTAG signal, it also introduced additional delay into the circuit which is equal to the signal transit time through the multiplexer 10. JTAG testing circuit 5 in this circuit module 6 introduces a delay of about 300–400 psec (picoseconds) into the IN to OUT path of the circuit module 6 in order to achieve the added-functionality created by the series-connected multiplexer 10.

Figure 1B:
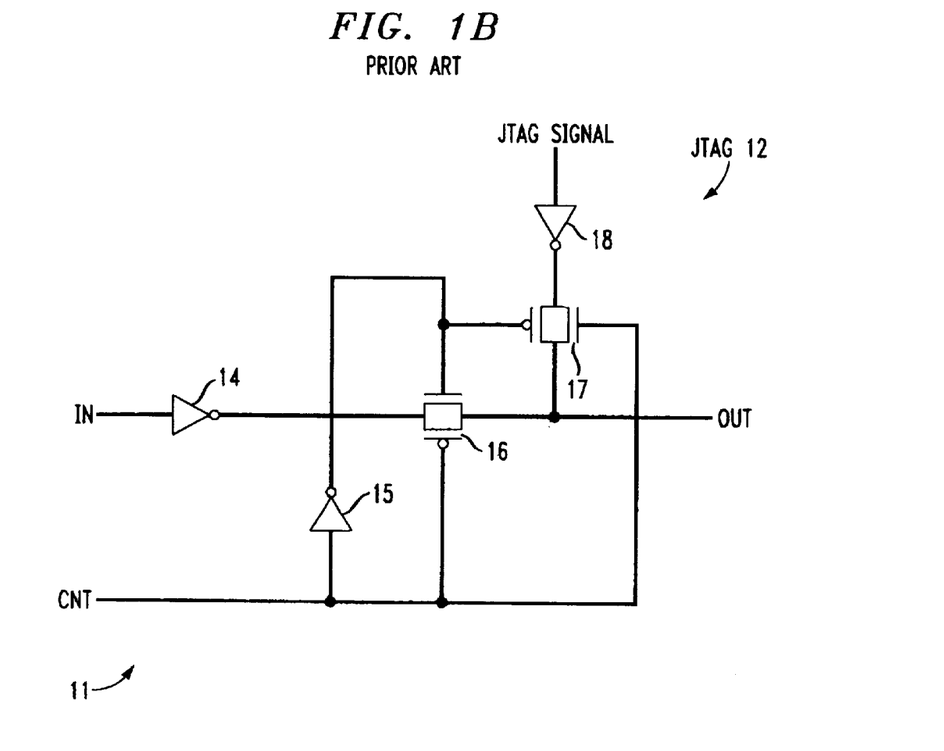
FIG. 1B is a schematic circuit diagram of another known JTAG testing circuit in a primary operating circuit.

FIG. 1B is a schematic block diagram illustration of another known JTAG testing circuit 12. The JTAG testing circuit 12 is implemented in a circuit module 11. The circuit module 11 includes an inverter 14, transmission gate 16 and an inverter 15. The JTAG testing circuit 12 includes transmission gate 17 and inverter 18.

Each of the transmission gates 16 and 17 consist of two transistors, a p-channel and an n-channel transistor. Generally, transmission gates operate as follows: when a low signal is applied to the p-channel and a high signal is applied to the n-channel transistors of a gate, the gate is enabled (i.e., the gate functions as a switch). In addition, a high signal at the p-channel and a low signal at the n-channel will disable a gate.

The CNT line controls the operation of transmission gates 16 and 17 such that when the CNT signal is low, transmission gate 16 is enabled and transmission gate 17 is disabled. Inverter 15 creates a CNT signal for application to the opposite sides of the transmission gates from the CNT signal. As a result, the CNT signal determines whether the circuit module 11 is operative (i.e., when gate 16 is enabled and gate 17 is disabled) or the JTAG testing circuit is operative (i.e., when gate 16 is disabled and gate 17 is enabled).

During normal operation of circuit 11, the IN signal is inverted in inverter 14 and is applied to the OUT node by gate 16. In the JTAG mode, gate 16 is disabled and the JTAG signal is inverted in inverter 18 and applied as the OUT node by gate 17. The implementation of the JTAG testing circuit 12 in this circuit module 11 introduces a delay of about 300–400 psec (picoseconds) into the IN to OUT path of the circuit module 11 because of the signal transit time through transmission gate 16 caused by the CNT line and the processing delays.

Figure 1C:
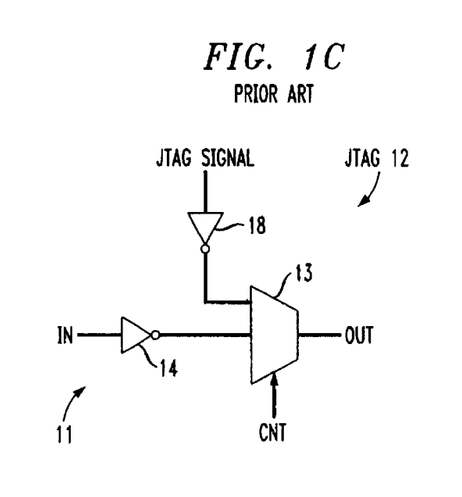
FIG. 1C is a schematic circuit diagram of still another known JTAG testing circuit in a primary operating circuit.

The circuit in FIG. 1C shows an inverter 14 while the JTAG test circuit comprises multiplexer 13 and inverter 18. During normal operation, the IN signal is applied through inverter 14 to OUT because of the effect of the CNT signal on the multiplexer 13.

In test mode, the CNT signal causes the JTAG signal from inverter 18 to be applied to OUT through the multiplexer 13. As a result of the multiplexer 13, there is added-functionality, but at the cost of signal delay through the multiplexer 13 in the IN to OUT path.

Figure 1D:
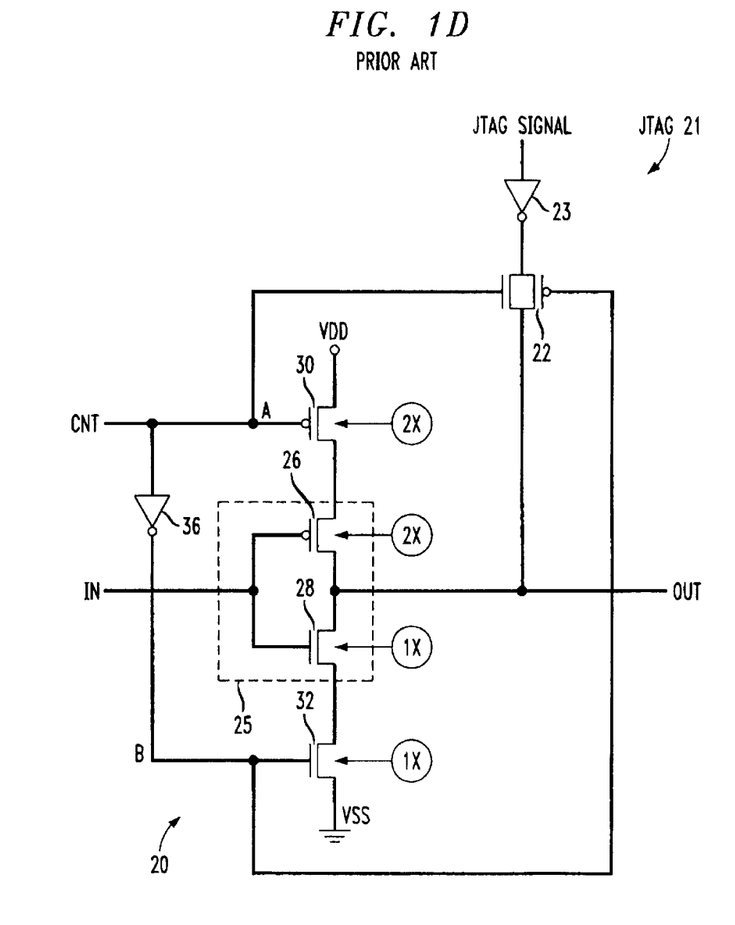
FIG. 1D is a schematic circuit diagram of another known JTAG testing circuit in a primary operating circuit.

FIG. 1D is a schematic block diagram illustration of another known JTAG testing circuit 21. The JTAG testing circuit 21 is implemented in a circuit module 20. The circuit module 20 includes an inverter 25 having two transistors 26 and 28. A data-in line (IN) is connected to the gate of transistors 26 and 28.

The JTAG testing circuit 21 includes an inverter 36, a transmission gate 22, an inverter 23 on the input to the transmission gate 22, a transistor 30 connecting a voltage source $V_{DD}$ to the inverter 25 and a transistor 32 connecting the inverter 25 to $V_{SS}$ or ground. A control line (CNT) is connected to the transistor 30 and gate 22 and through inverter 36 to the transistor 32 and the other side of gate 22.

The transistors 30 and 32 are added to enable or disable the JTAG testing circuit 21 and the circuit module 20. In addition, the CNT line and the inverter 36 are added to control the transistors 30 and 32 and the transmission gate 22 in order to operate the JTAG testing circuit 21. The transistors 26 and 30 are p-channel transistors, while the transistors 28 and 32 are n-channel transistors.

Figure 2:
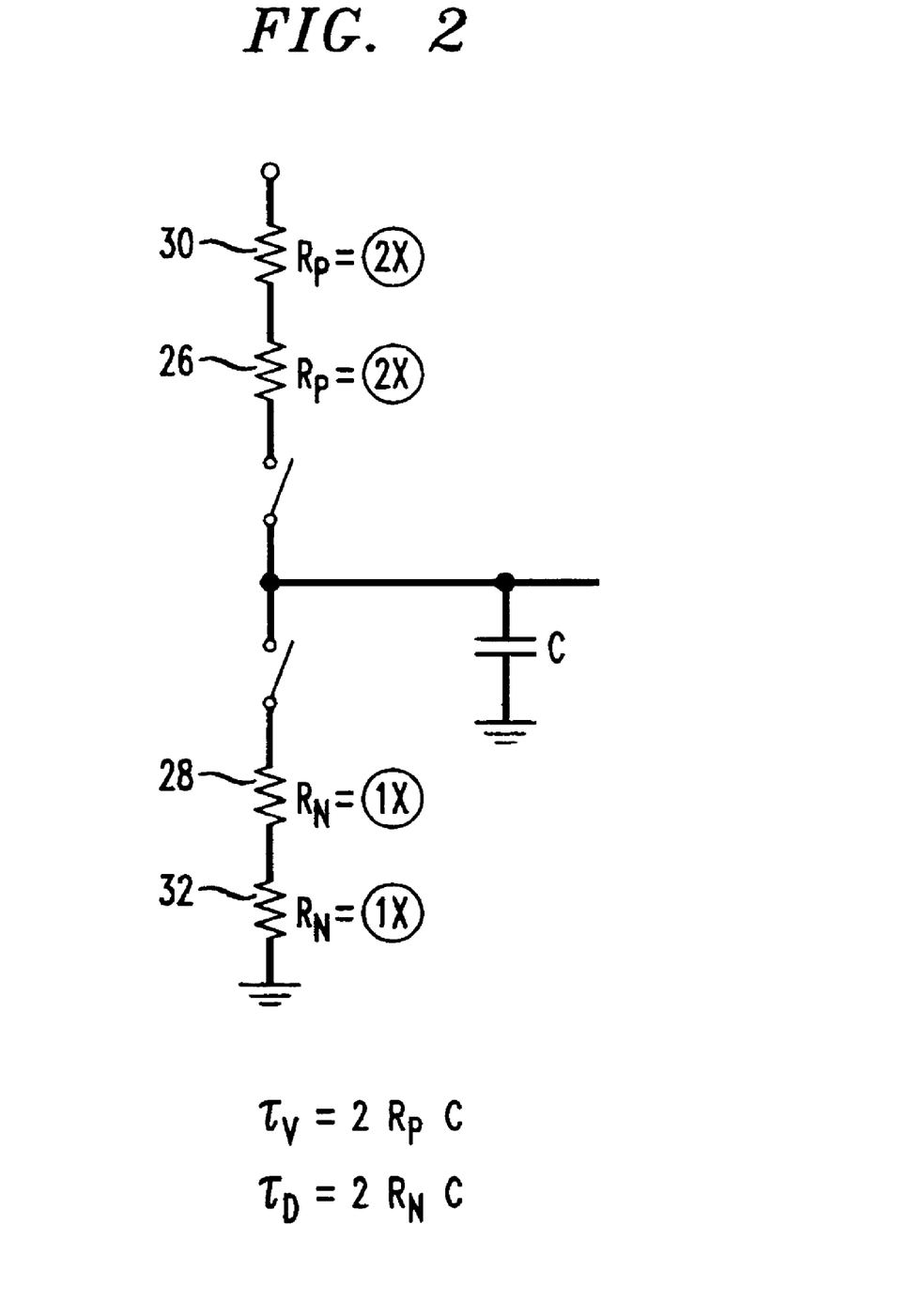
FIG. 2 is an RC representation of the circuit in FIG. 1D.

In known systems, the width or size of the transistor (typically measured in μm) of each of the p-channel transistors (26 and 30) is the same, and the width of each of the n-channel transistors (28 and 32) is also the same, while the width of the p-channel transistors (26 and 30) is typically two times larger than the n-channel transistors (28 and 32). The widths of the transistors in FIG. 1D are shown as values which are circled, for ease of reference. The width of a transistor is inversely proportional to its resistance. Therefore, the larger a transistor's width, the smaller its resistance. In addition, as shown in FIG. 2, this known FIG. 1D JTAG testing circuit 21 doubles the RC time constant for the circuit module (where R is the resistance and C is the capacitance of the combination transmission gate 22 and inverter 23 load) based on the RC time constant being 2RC or twice the resistance for both the $V_{DD}$ voltage source and $V_{SS}$ ground.

In this known JTAG implementation, the width of the transistors 30 and 32 compared to the transistors 26 and 28 causes a propagation delay in the normal or non-JTAG testing mode of operation of the circuit module 20. During normal operation, when the CNT signal is low, the signal at node A is low and the signal at node B, based on the inverter 36, is high. The A signal is applied to the transistor 30. When A is low, the transistor 30 is enabled (and, conversely, when A is high, the transistor 30 is disabled). The B signal is applied to the transistor 32. When B is high, the transistor 32 is enabled (and, conversely, when B is low, the transistor 32 is disabled). Therefore, where A is low, the transistor 30 is enabled and the transistor 32 is also enabled. It follows that where A is low, the $V_{DD}$ source and $V_{SS}$ are both connected to the inverter 25. In addition, the CNT signal also enables and disables the transmission gate 22. Where CNT (i.e. the signal at node A) is low such that the signal to control the p-channel transistor in gate 22 is high (as a result of the inverter 36) while the n-channel transistor gate voltage is low, both the p-channel and n-channel transistors of gate 22 are disabled. Thereby, the JTAG testing circuit is disabled.

In addition, when the IN signal is low, the transistor 26 is enabled while the transistor 28 is disabled (and, conversely, when the IN signal is high, the transistor 26 is disabled while the transistor 28 is enabled). Therefore, if A is low such that the transistors 30 and 32 are enabled, the IN signal will generate a closed circuit for either transistors 26 and 30

(where the IN signal is low) or transistors 28 and 32 (where the IN signal is high). As a result, the OUT path will receive either $V_{DD}$ or be grounded.

Accordingly, to operate the circuit module 20 without the JTAG testing circuit 21, the CNT signal is a low signal to enable transistors 30 and 32. As a result, normal operation of the circuit module 20 is implemented such that the IN signal controls the output of the inverter 25. However, since the transistors 30 and 32 are equivalent to the width of the transistors 26 and 28, their resistance is significant, such that there is a propagation delay from the $V_{DD}$ source or ground to the output of the inverter 25. Therefore, in normal operation, the additional components for implementing JTAG, i.e., the transistors 30 and 32, add a propagation delay to the normal operation circuit module 20. This propagation delay has been found to be a few hundred pico-seconds in 0.35 $\mu$m CMOS technology.

Figure 3:
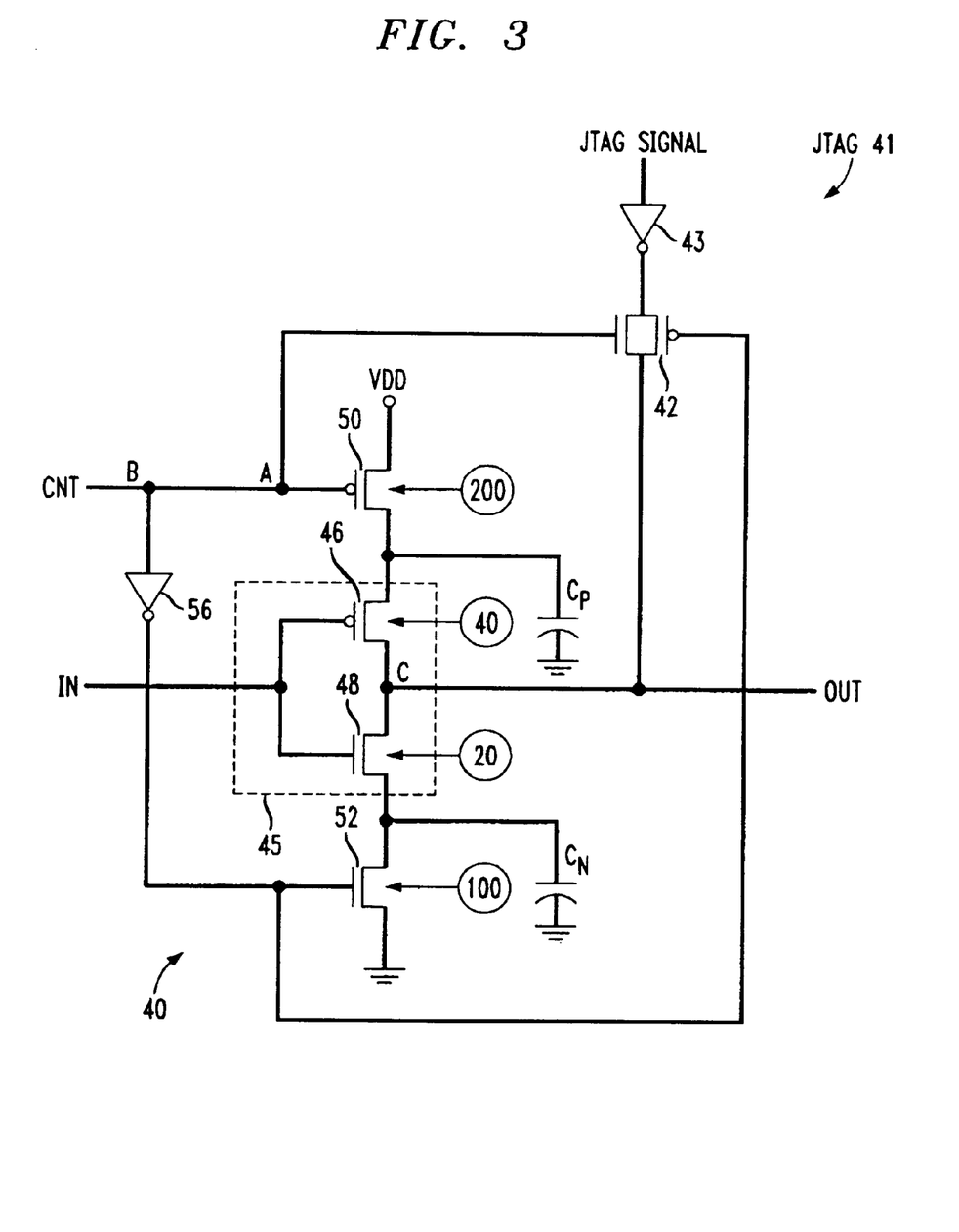
FIG. 3 is a schematic circuit diagram of a JTAG testing circuit according to an embodiment of the present invention in a primary operating circuit.

FIG. 3 is a schematic block diagram of a JTAG testing circuit implementation according to the present invention. The components of the circuit module 40 (which can also be referred to as the primary or normal operating circuit) and the JTAG testing circuit 41 are the same as for the known implementation of the JTAG testing circuit 21 shown in FIG. 1D. Namely, the JTAG testing circuit 41 is implemented in a circuit module 40. The circuit module 40 includes an inverter 45 having two transistors 46 and 48, a data-in line (IN) to the transistors 46 and 48. The JTAG testing circuit 41 includes a transmission gate 42 and an inverter 43 on the input to the gate 42, a transistor 50 connecting a voltage source $V_{DD}$ to the inverter 45, a transistor 52 connecting the inverter 45 to $V_{SS}$ or ground, a control line (CNT) to the transistor 50 and one side of gate 42, an inverter 56 connected from the input CNT line to the transistor 52 and the other side of the transmission gate 42.

This circuit module 40 and JTAG testing circuit 41 also operate based on the same input signals (i.e., the CNT and IN signals) and function in the same manner as the corresponding component in the FIG. 1D known implementation. However, the characteristics of the transistors 50 and 52 support the implementation of the JTAG testing circuit 41 by reducing propagation delays during normal or non-JTAG testing mode operation of the circuit module 40. More particularly, an aspect of an exemplary embodiment of the present invention is the width of the transistors 46, 48, 50 and 52.

According to this embodiment of the present invention, the conventional relationships between the widths of the p-channel (46 and 50) and n-channel (48 and 52) transistors are not used. In particular, the same size width of each of the p-channel transistors (46 and 50) and each of the n-channel transistors (46 and 48) and the double width of the p-channel transistors (46 and 50) compared to the n-channel transistors (46 and 48) is not used. Rather, in the present invention, the p-channel 50 and n-channel 52 transistors used for the JTAG testing circuit 41 are larger (i.e., on a scale of at least two times or more, preferably three or five times wider) than the corresponding p-channel 46 and n-channel 48 transistors. This is shown in the exemplary embodiment of FIG. 3, where the sizes of the transistors 50, 46, 48 and 52 are 200, 40, 20 and 100, respectively (while $\mu$m is the typical unit for the width of transistors, these values are relative to the widths of the other transistors; the widths of the transistors in FIG. 3 are shown as values which are circled, for ease of reference (this convention is continued for the remaining figures herein). In non-JTAG testing mode operation of the circuit module 40, the resistance of the transistors 50 and 52 is so minimal that they effectively create pseudo-$V_{DD}$ and $V_{SS}$ sources for the circuit module 40 and the inverter 45 in particular. The pseudo-$V_{DD}$ and $V_{SS}$ can be, for example, 10% of the difference between $V_{DD}$ and $V_{SS}$ or, as another example, about 300 mv or less. As a result, the transistors 50 and 52 minimally affect the speed of the such normal operation.

In addition, since the JTAG testing circuitry 41 uses low frequency signals, the use of large width transistors 50 and 52 does not adversely impact the performance of the JTAG testing circuitry 41. Once the JTAG path is activated, transmission gate 42 is enabled and the JTAG signal can propagate to the output OUT. However, node C has an additional parasitic capacitive load $C_P$ (when IN is low) or $C_N$ (when IN is high) that needs to be charged. The inverter 43 and gate 42 must be able to drive this additional load-in time. In addition, FIG. 3 also illustrates capacitive loads $C_P$ and $C_N$ added to the transistors 50 and 52. Such devices $C_P$ and $C_N$ can be used in alternative embodiments of the present invention in order to establish an improved pseudo-$V_{DD}$ and $V_{SS}$ across devices 50 and 52. More particularly, when the transistors 50 and 52 are enabled, the charge is built up in the capacitors as well as the resistive paths across transistors 50 and 52, thereby supporting the storage of charge for devices 50 and 52 to form more stable $V_{DD}$ and $V_{SS}$ sources.

Figure 4:
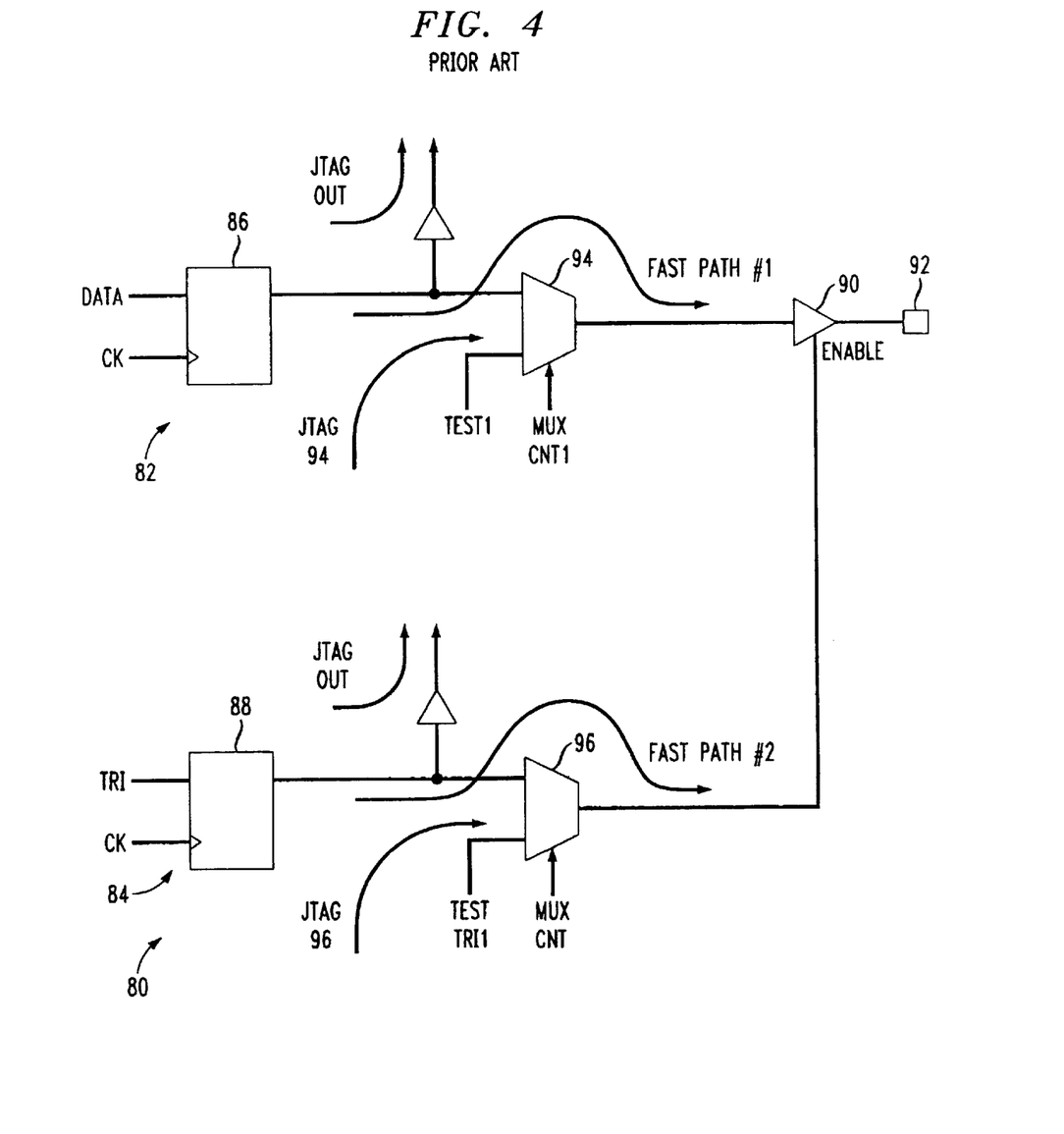
FIG. 4 is a known schematic block diagram of the JTAG circuit in a primary operating circuit of FIG. 1 applied to an output buffer.

FIG. 4 is a prior art circuit used to add JTAG capability to an output buffer. The output buffer 90 has a DATA path and a TRI (Tristate) control. DATA propagates through the flip-flop 86, multiplexer (MUX) 94 and output buffer 90 and is applied to pad 92 (i.e., the port which physically connects the chip to external devices) when the TRI signal enables the output buffer 90. Otherwise, the TRI signal disables the output buffer 90 and blocks the propagation of the DATA signal. The paths #1 and #2 correspond to the paths between the DATA and TRI input signals to the output buffer 90 during normal operation of the circuit modules. It is desirable to have paths #1 and #2 be as fast as possible. As described above regarding FIG. 3, the paths #1 and #2 can have a decreased delay by replacing the MUXs with the circuit of FIG. 3. Also, JTAG output signals are well known to those of ordinary skill in the art and, therefore, will not be further described herein.

Figure 5:
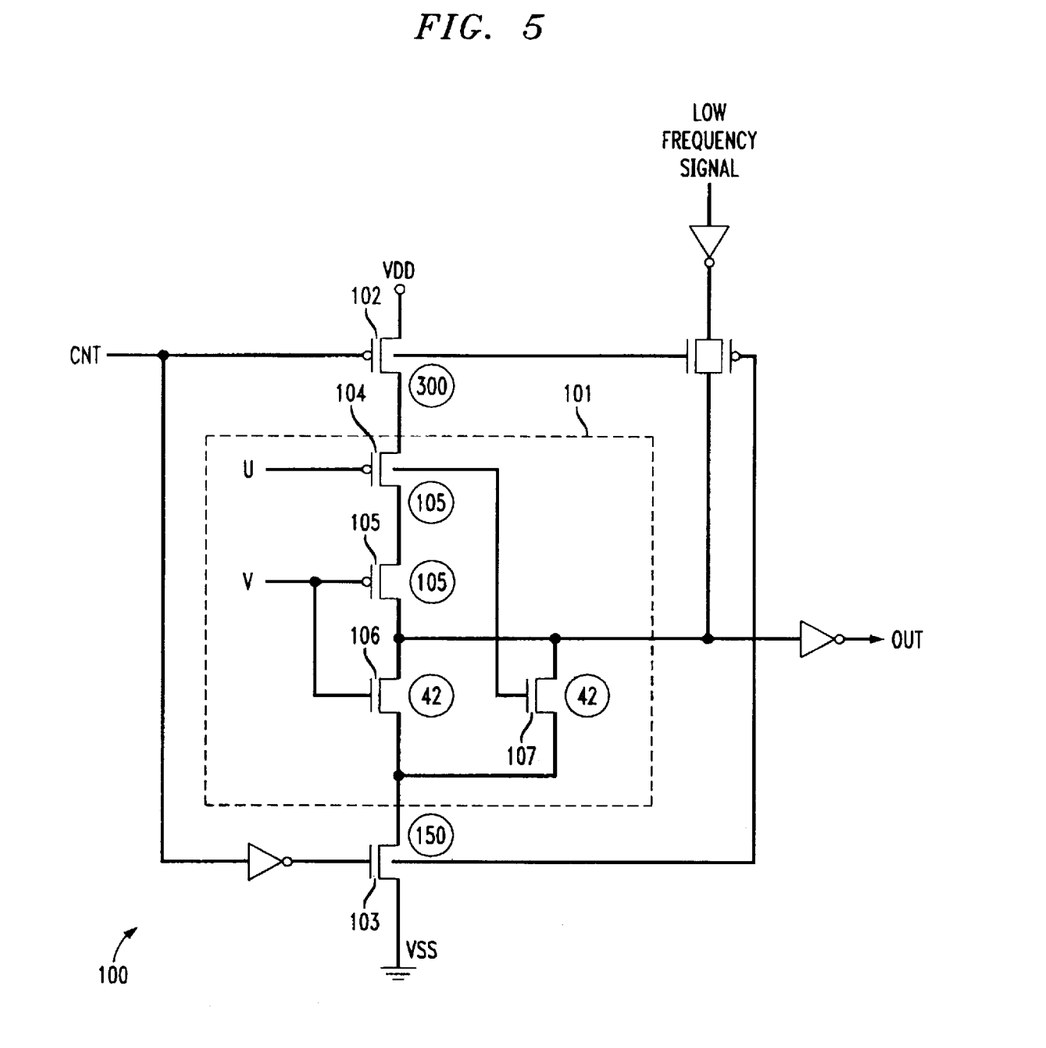
FIG. 5 is a schematic circuit diagram of an embodiment of the present invention which adds functionality to a node of a primary operating circuit without implementing JTAG.

FIG. 5 illustrates that the present invention can be applied to add functionality to a circuit module, e.g., introducing signals in addition to JTAG testing signals to the output of a circuit module. Such additional functionality can be applied to, as examples, NAND or NOR gates, or any combinatorial logic. For example, the circuit 100 of FIG. 5 applies the added-functionality to a NOR gate 101. Transistors 102 and 103 are at least two times larger than transistors 104/105 and 106/107, respectively. FIG. 5 further illustrates that the width of transistors 102 and 103 are at least two times the width of the largest component 101 transistors from the paths $V_{DD}$ to OUT and $V_{SS}$ to OUT. More particularly, the width of the transistor 102 is at least two times the width of the transistor 104 or 105. Similarly, the width of the transistor 103 is at least two times the width of the transistor 106 or 107. Thus, the NOR gate 101 has pseudo-$V_{DD}$ and $V_{SS}$ sources applied to its power supply modes via transistors 102 and 103.

Figure 6A:
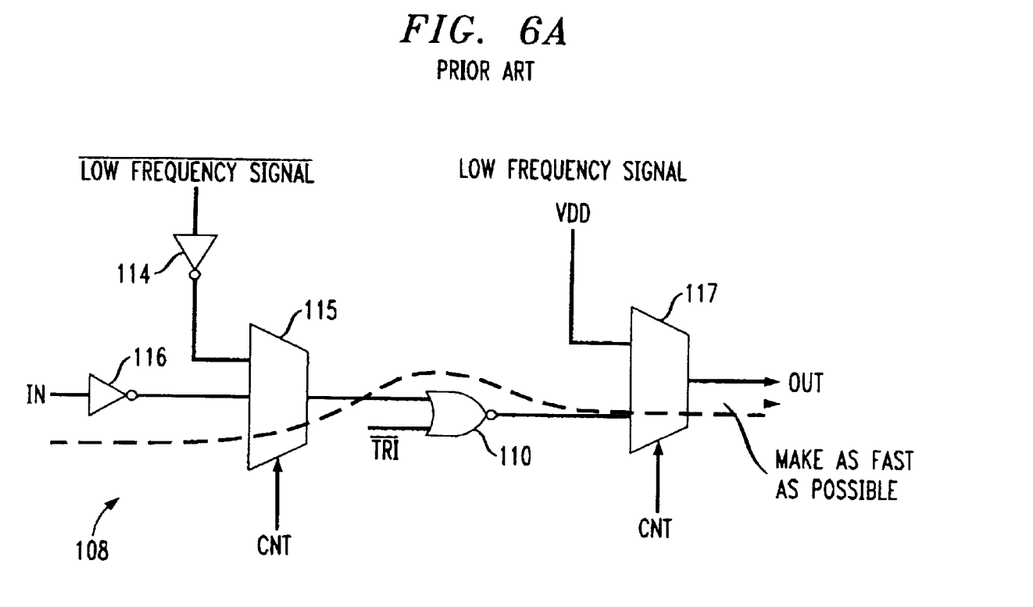
FIG. 6A is a schematic circuit diagram of a known non-testing added-function circuit in a primary operating circuit.

FIG. 6A further illustrates a known approach for adding functionality to a circuit 108 containing, in schematic block diagram form, two MUXs 115 and 117, an inverter 116 and a NOR gate 110. The MUXs 115 and 117 are the added-function circuit, such as a JTAG circuit, another testing circuit or a non-testing circuit using a low frequency signal is implemented in this circuit 108. As a result of implementing the added-function circuit, four gates 110, 115, 116 and 117 are encountered in the path from IN to OUT and propagation delays are introduced in the circuit 108. FIG. 6A also illustrates a dotted path as the fast path of desired reduced delay from IN to OUT.

Figure 6B:
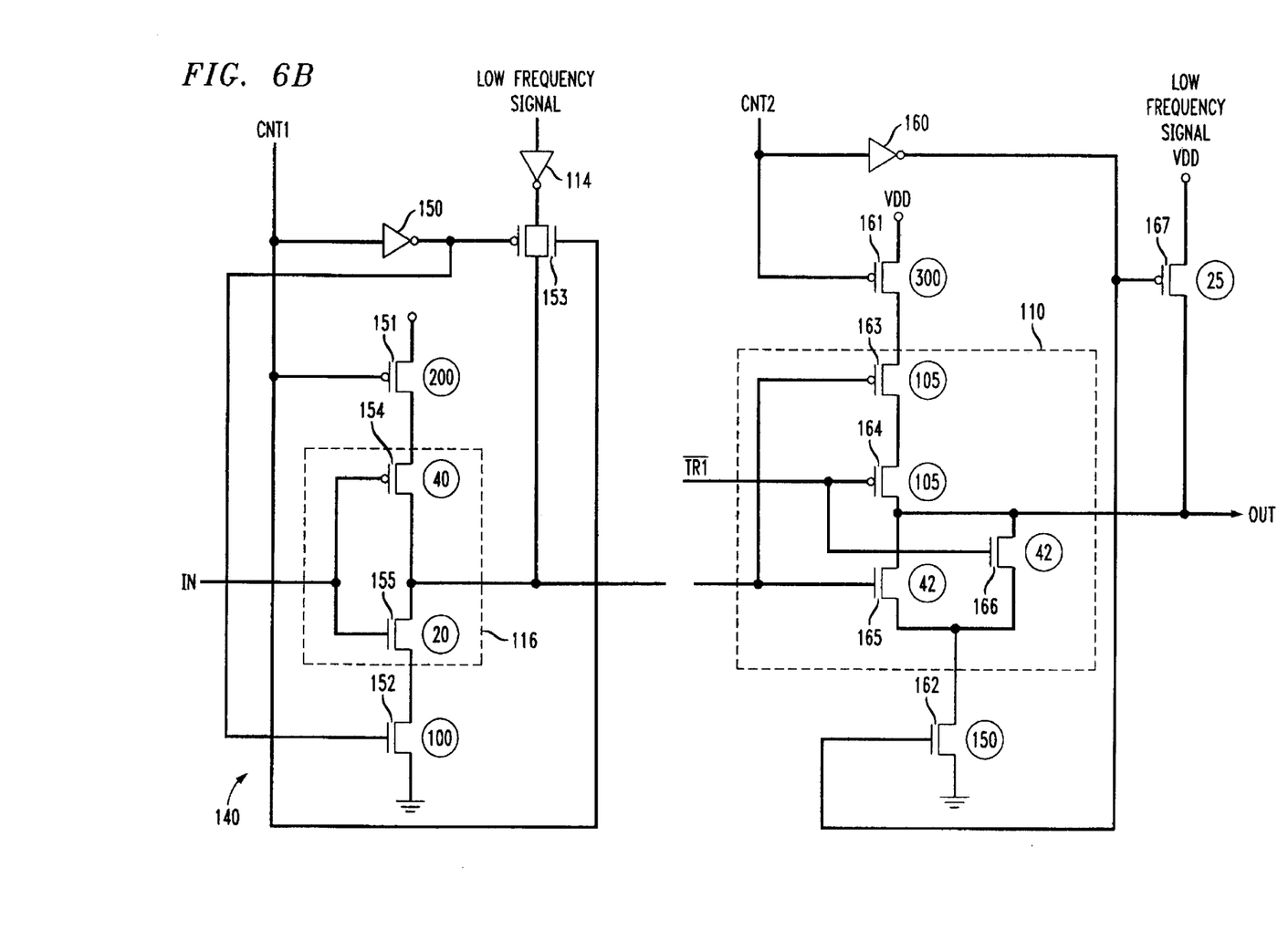
FIG. 6B is a schematic circuit diagram of a non-testing added-function circuit according to another embodiment of the present invention in a primary operating circuit.

FIG. 6B illustrates an approach of implementing the same added-function circuit of FIG. 6A to form the circuit 140. That is, the added-function circuit components 115 and 117 are converted to alternative components and reconfigured in order to reduce any propagation delays based on the non-testing circuit components 115 and 117. This approach is similar to that used in converting the known circuit 11 of FIG. 1C to the known circuit 20 of FIG. 1D. The known circuit 11 of FIG. 1C includes two gates, i.e., the inverter 14 and the MUX 13, in the IN to OUT path during normal operation (or non-JTAG testing mode) of the circuit 20. The known circuit 20 of FIG. 1D includes only one gate, i.e, the inverter 25, in the IN to OUT path during normal operation (or non-JTAG testing mode) of the circuit 20. More particularly, as to FIGS. 1C and 1D, FIG. 1C shows an inverter 14 with an added JTAG circuit. This same arrangement is shown in FIG. 1D, where the inverter 25 has an added JTAG circuit. Thus, the inverter 14 and MUX 13 of FIG. 1C can be converted to the inverter 25, transmission gate 22, inverter 36 and transistors 30 and 32 of FIG. 1D. Accordingly, the circuit of FIG. 1D has two gates less than the circuit of FIG. 6A in the IN to OUT path, thereby, allowing a shorter time delay from the IN to OUT terminals, as known from the prior art.

When the conversion from FIG. 6A to 6B is made as described above, the FIG. 6B components MUX 115 is replaced with an inverter 150, transistors 151 and 152 and a transmission gate 153 and the MUX 117 is replaced with the inverter 160, the transistors 161 and 162 and the transmission gate 167. As a result, in FIG. 6B, only two gates, i.e., gates 116 (including the transistors 154 and 155) and 110 (including the transistors 163–166), are encountered. Thus, the circuit 140 of FIG. 6B has two gates less than the circuit 108 of FIG. 6A in the IN to OUT path, thereby, allowing a shorter delay from the IN to OUT terminals. Like the conversion from FIG. 1C to FIG. 1D, this approach is known in the art.

In FIG. 6B, however, according to an embodiment of the present invention, the non-testing circuit transistors 161 and 162 are also about two times the width of the largest NOR gate 110 transistors 163/164 and 165/166, respectively, in the path from $V_{DD}$ to the OUT terminal and from $V_{SS}$ to the OUT terminal, respectively. Accordingly, the circuit 140 provides a fast path through gates 110 and 116 based on a pseudo-$V_{DD}$ and pseudo-$V_{SS}$ when the transistors 151/152 and 161/162 are enabled. In addition, FIG. 6B also illustrates a nontesting added-function circuit 140 according to an embodiment of the present invention based on implementing the circuit 40 of FIG. 3 and the circuit 100 of FIG. 5. The FIG. 6B inverter 116 and non-testing circuit (components 150–153) operate in the same manner as the circuit is 40 of FIG. 3 where the propagation delays through the inverter 116 are reduced. Similarly, the FIG. 6B NOR gate 110 and non-testing circuit (components 160, 161, 162 and 167) operate in the same manner as the circuit 100 of FIG. 5 where the propagation delays through the NOR gate 110 are reduced.

While the invention has been particularly shown and described with reference to preferred embodiments thereof, it will be understood by those skilled in the art that various changes in form and details may be made therein without departing from the spirit and scope of the invention. For example, embodiments of the present invention for added-function non-JTAG testing circuits include built-in self-test (BIST) circuits which are well known in the art.

I claim:

1. An integrated circuit including a primary operating circuit and an added-function circuit which reduces propagation delays during normal operation of said primary operating circuit, said integrated circuit comprising:

said primary operating circuit including an input, an output, a logic circuit having a gate element and being connected between the input and the output, an associated voltage source and a ground; and an added-function circuit including a first transistor, a second transistor and a control path, at least one source logic device in said gate element connected between said voltage source and the output, at least one ground logic device in said gate element connected between said, ground and the output, said first transistor coupled in series between said voltage source and said gate element and having a width of at least two times the width of the widest said source logic device, said second transistor coupled in series between said ground and said gate element, said second transistor having a width of at least two times the width of the widest said ground logic device, and said control path selectively enabling or disabling said first and second transistors.

2. The circuit of claim 1, wherein said gate element is an inverter, NAND gate or NOR gate.

3. The circuit of claim 1, wherein said added-function circuit further comprises a first capacitor coupled to said first transistor.

4. The circuit of claim 1, wherein said circuit is an integrated circuit.

5. The circuit of claim 1, wherein said added-function circuit further comprises an added-function logic circuit coupled to the output path from said primary operating circuit and associated with said control path, said control path enables and disables said added function logic circuit, wherein when said added-function circuit is enabled, said control path disables said first and second transistors in order to allow said added-function circuit to provide said voltage to the output path in place of said primary operating circuit.

6. The circuit of claim 1, wherein said first transistor is a p-channel transistor and said second transistor is an n-channel transistor and said added-function circuit further includes a means for inverting a signal from said control path to one of said first or second transistors in order for said control path signal to enable and disable said first and second transistors together.

7. The circuit of claim 1, wherein said added-function circuit is a testing circuit.

8. The circuit of claim 1, wherein said added-function circuit is a Joint Test Action Group testing circuit.

9. The circuit of claim 1, wherein said added-function circuit is a non-testing circuit.

10. An integrated circuit including a primary operating circuit and a in added-function circuit which reduces propagation delays during normal operation of said primary operating circuit, said circuit comprising:

said primary operating circuit including an input, an output, a logic circuit having a gate element and being connected between the input and the output, an associated voltage source and a ground, a first transistor positioned on the path between the voltage source and the output and a second transistor positioned on the path between the ground and the output; and an added-function circuit including a third transistor, a fourth transistor and a control path, said third transistor coupled between said voltage source and said first transistor and having a width of at least two times the width of said first transistor, said fourth transistor coupled between said ground and said second transistor and having a width of at least two times the width of said second transistor, and said control path selectively enabling or disabling said third and fourth transistors.

11. The circuit of claim 10, wherein said circuit is an integrated circuit.

12. The circuit of claim 10, further comprising when said control path signal enables both of said third and fourth transistors, said third transistor generates a pseudo-voltage for said first transistor which is substantially equal to said voltage source and said fourth transistor generates a pseudo-ground for said second transistor which is substantially equal to said ground.

13. The circuit of claim 10, wherein said added-function circuit further comprises a first capacitor coupled to said third transistor and a second capacitor coupled to said fourth transistor.

14. The circuit of claim 10, wherein said added-function circuit further comprises an added-function logic circuit coupled to the output path from said primary operating circuit and associated with said control path, said control path enables and disables said added function logic circuit, wherein when said added function circuit is enabled, said control path disables said third and fourth transistors in order to allow said added-function circuit to provide said voltage to the output path in place of said primary operating circuit.

15. The circuit of claim 10, wherein said third transistor is a p-channel transistor and said fourth transistor is an n-channel transistor and said added-function circuit further includes a means for inverting a signal from said control path to one of said third or fourth transistors in order for said control path signal to enable and disable said third and fourth transistors together.

16. The circuit of claim 10, wherein said added-function circuit is a testing circuit.

17. The circuit of claim 10, wherein said added-function circuit is a Joint Test Action Group testing circuit.

18. The circuit of claim 10, wherein said added-function circuit is a non-testing circuit.

19. A circuit including a plurality of primary operating circuits and a plurality of added-function circuits which reduces propagation delays during normal operation of said primary operating circuits, said circuit comprising:

each of said primary operating circuits including an input, an output, a logic circuit having a gate element and being connected between the input and the output, an associated voltage source and a ground; and each of said added-function circuits including a first transistor, a second transistor and a control path, at least one source logic device in said gate element connected between said voltage source and the output, at least one ground logic device in said gate element connected between said ground and the output, said first transistor coupled between said voltage source and said gate element and having a width of at least two times the width of the widest said source logic device, said second transistor coupled between said ground and said gate element, said second transistor having a width of at least two times the width of the widest said ground logic device, and said control path selectively enabling or disabling said first and second transistors.

20. The circuit of claim 19 wherein said gate element of each of said plurality of primary operating circuits is one of an inverter, NAND gate or NOR gate.

21. The circuit of claim 19, wherein said circuit is an integrated circuit.

* * * * *